United States Patent
Hwang et al.

(10) Patent No.: US 8,710,591 B2
(45) Date of Patent: Apr. 29, 2014

(54) SEMICONDUCTOR CHIP, STACK MODULE, AND MEMORY CARD

(75) Inventors: Hyong-ryol Hwang, Seoul (KR); Ho-cheol Lee, Yongin-si (KR); Byong-wook Na, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 369 days.

(21) Appl. No.: 12/868,091

(22) Filed: Aug. 25, 2010

(65) Prior Publication Data

US 2011/0095373 A1    Apr. 28, 2011

(30) Foreign Application Priority Data

Oct. 27, 2009  (KR) .................. 10-2009-0102286

(51) Int. Cl.
*H01L 27/088*  (2006.01)
*H01L 23/48*   (2006.01)

(52) U.S. Cl.
USPC .......... 257/368; 257/741; 257/774; 257/530; 257/777; 438/667; 438/152; 438/131; 438/132

(58) Field of Classification Search
USPC .......... 257/368, 741, 774, 530, 777; 438/667, 438/152, 131, 132, 109
See application file for complete search history.

(56) References Cited

U.S. PATENT DOCUMENTS

| | | | |
|---|---|---|---|
| 6,316,315 B1 * | 11/2001 | Hofmann et al. ............. 438/259 |
| 6,633,075 B1 | 10/2003 | Shirakawa |
| 6,903,422 B2 * | 6/2005 | Goda et al. ................ 257/365 |
| 6,906,379 B2 * | 6/2005 | Chen et al. ................ 257/315 |
| 6,972,220 B2 * | 12/2005 | Bertin et al. ................ 438/152 |
| 7,213,336 B2 * | 5/2007 | Alcoe et al. ................ 29/852 |
| 7,446,417 B2 * | 11/2008 | Yoshioka ................ 257/758 |
| 7,960,282 B2 * | 6/2011 | Yelehanka et al. .......... 438/667 |
| 8,264,065 B2 * | 9/2012 | Su et al. ................ 257/621 |
| 2008/0057647 A1 * | 3/2008 | Ho et al. ................ 438/259 |
| 2009/0127667 A1 * | 5/2009 | Iwata ................ 257/621 |
| 2009/0261457 A1 * | 10/2009 | Pratt ................ 257/621 |
| 2010/0052157 A1 * | 3/2010 | Pratt ................ 257/712 |
| 2010/0148293 A1 * | 6/2010 | Jain et al. ................ 257/434 |
| 2010/0167467 A1 * | 7/2010 | Aoi ................ 438/109 |
| 2010/0171218 A1 * | 7/2010 | Aoi ................ 257/741 |

FOREIGN PATENT DOCUMENTS

| | | | |
|---|---|---|---|
| JP | 2000-156494 A | 6/2000 |
| JP | 2001-060593 A | 3/2001 |
| JP | 2001-308108 A | 11/2001 |

* cited by examiner

*Primary Examiner* — Lex Malsawma
*Assistant Examiner* — Sheng Zhu
(74) *Attorney, Agent, or Firm* — Lee & Morse, P.C.

(57) ABSTRACT

Provided are a semiconductor chip including a TSV passing through a transistor, and a stack module and a memory card using such a semiconductor chip. The semiconductor chip may include a semiconductor layer that has a first surface and a second surface opposite to each other. A conductive layer may be disposed on the first surface of the semiconductor layer. A TSV may pass through the semiconductor layer and the conductive layer. A side wall insulating layer may surround a side wall of the TSV in order to electrically insulate the semiconductor layer and the conductive layer from the TSV.

20 Claims, 14 Drawing Sheets

SEMICONDUCTOR CHIP, STACK MODULE, AND MEMORY CARD

BACKGROUND

1. Field

The inventive concept relates to a semiconductor device, and more particularly, to a semiconductor chip including a through-silicon via (TSV), and a stack module and a memory card using the semiconductor chip including a TSV.

2. Description of the Related Art

As the integration density of semiconductor chips increases, a semiconductor chip or a semiconductor package using a TSV passing through a semiconductor substrate has been suggested. A conductive pad may be connected to another semiconductor chip or another semiconductor substrate through the TSV. In order to remove high frequency noise in a power supply or stably provide necessary power to a device, a decoupling capacitor having as large capacitance as possible may also be inserted into the semiconductor chip.

SUMMARY

Embodiments are therefore directed to semiconductor chips, stack modules, and memory cards, which substantially overcome one or more of the problems due to the limitations and disadvantages of the related art.

It is therefore a feature of an embodiment to provide a semiconductor chip including a TSV that passes through a transistor, in order to efficiently use a limited space and achieve high integration density.

It is therefore a separate feature of an embodiment to provide a stack module including a semiconductor chip including a TSV that passes through a transistor, in order to efficiently use a limited space and achieve high integration density.

It is therefore a separate feature of an embodiment to provide a memory card including a semiconductor chip including a TSV that passes through a transistor, in order to efficiently use a limited space and achieve high integration density.

Although the semiconductor chip, the stack module, and the memory card are exemplarily provided, the inventive concept is not limited thereto.

At least one of the above and other features and advantages may be realized by providing a semiconductor chip, including a semiconductor layer having a first surface and a second surface opposite to each other, a conductive layer disposed on the first surface of the semiconductor layer, a TSV passing through the semiconductor layer and the conductive layer, and a side wall insulating layer surrounding a side wall of the TSV and electrically insulating the conductive layer from the TSV.

The conductive layer may be a gate electrode of a transistor.

An active region may be defined in the semiconductor layer and may include a source region, a drain region, and a channel region. A gate insulating layer may be disposed between the first surface of the semiconductor layer and the conductive layer to cover the channel region.

An insulating layer may be disposed on the first surface of the semiconductor layer to cover the conductive layer and may be penetrated by the TSV, and a conductive pad may be disposed on the insulating layer and may be electrically connected to the TSV.

An inter-layer insulating layer may be disposed on the first surface of the semiconductor layer to cover the conductive layer and may be penetrated by the TSV. A multi-layer wiring pattern may be disposed on the inter-layer insulating layer and may be electrically connected to the TSV. An inter-metal insulating layer may be disposed on the inter-layer insulating layer to cover the multi-layer wiring pattern. A conductive pad may be disposed on the inter-metal insulating layer and may be electrically connected to the TSV through the multi-layer wiring pattern.

A plurality of contact plugs may pass through the inter-layer insulating layer and may connect the conductive layer, the source region, and the drain region to the multi-layer wiring pattern. The source region and the drain region may be n-type regions and may be connected to a ground voltage source through the multi-layer wiring pattern, and the conductive layer may be connected to a power voltage source through the multi-layer wiring pattern. The source region and the drain region may be p-type regions and may be connected to a power voltage source through the multi-layer wiring pattern, and the conductive layer may be connected to a ground voltage source through the multi-layer wiring pattern.

An integrated circuit layer may be disposed between the first surface of the semiconductor layer and the inter-layer insulating layer and may be electrically connected to the multi-layer wiring pattern. The integrated circuit layer may include a volatile memory cell including a gate electrode layer or a non-volatile memory cell including a control gate electrode layer, and the conductive layer may includes the same material as the gate electrode layer or the control gate electrode layer.

The conductive layer may have an opening, the area of which is greater than a sum of the cross-sectional area of the TSV and the cross-sectional area of the side wall insulating layer. The TSV vertically may pass through the conductive layer and the semiconductor layer.

A portion of the TSV may protrude from the second surface of the semiconductor layer and the side wall insulating layer may expose a side wall of the portion of the TSV protruding from the second surface of the semiconductor layer. The TSV may have a width that decreases or increases toward the second surface of the semiconductor layer. The TSV may include a first portion having a constant width and a second portion having a width that decreases toward the second surface of the semiconductor layer. The TSV may further include a conductive tap formed around a contact point between the TSV and the second surface of the semiconductor layer.

At least one of the above and other features and advantages may be separately realized by providing a stack module, including a module substrate, and a plurality of semiconductor chips stacked on the module substrate, wherein at least one semiconductor chip of the plurality of semiconductor chips includes a semiconductor layer; a conductive layer disposed on the semiconductor layer, a TSV passing through the semiconductor layer and the conductive layer, and a side wall insulating layer surrounding a side wall of the TSV and electrically insulating the semiconductor layer and the conductive layer from the TSV, wherein the at least one semiconductor chip is electrically connected to an adjacent semiconductor chip through the TSV.

At least one of the above and other features and advantages may be separately realized by providing a memory card including a housing, a memory chip disposed in the housing; and a controller disposed in the housing and controlling the memory chip, wherein the memory chip includes: a semiconductor chip, a conductive layer disposed on the semiconductor layer, a TSV passing through the semiconductor layer and the conductive layer, and a side wall insulating layer surrounding a side wall of the TSV and electrically insulating the semiconductor layer and the conductive layer from the TSV.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
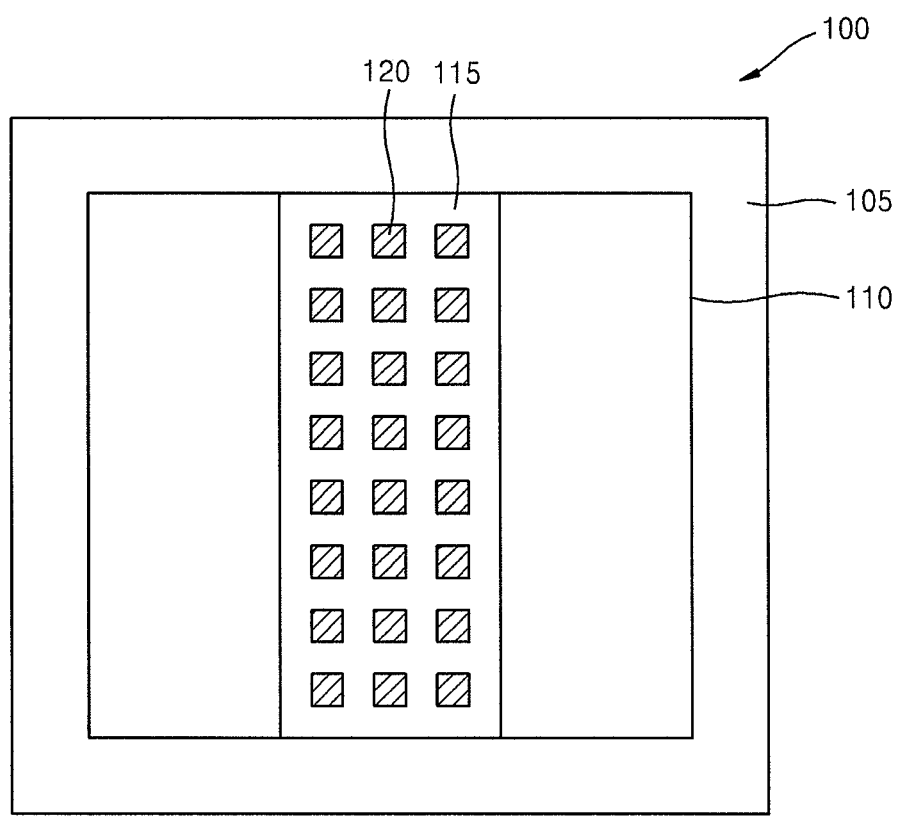
FIG. 1 illustrates a top plan view of a semiconductor chip according to an embodiment of the present concept.

Korean Patent Application No. 10-2009-0102286, filed on Oct. 27, 2009, in the Korean Intellectual Property Office, and entitled: "Semiconductor Chip, Stack Module, and Memory Card," is incorporated by reference herein in its entirety.

The present concept will now be described more fully with reference to the accompanying drawings, in which embodiments of the present concept are shown. This should not be construed as limiting the claims to the embodiments shown. Rather, these embodiments are provided so that the present concept will be thorough and complete and will fully convey the scope of the present concept to one of ordinary skill in the art.

Unless defined otherwise, technical and scientific terms used herein have the same meaning as is commonly understood by one of ordinary skill in the art to which the present concept belongs. As used herein, the singular forms "a," "an" and "the" are intended to include the plural forms as well, unless the context clearly indicates otherwise. It will also be understood that when a layer is referred to as being "on" another layer, it can be directly on the other layer, or intervening layers may also be present therebetween. As used herein, the term "and/or" includes any and all combinations of one or more of the associated listed items.

It will be further understood that the terms "comprises", "includes", "comprising" and/or "includes" used herein specify the presence of stated features, integers, steps, operations, members, components, and/or groups thereof, but do not preclude the presence or addition of one or more other features, integers, steps, operations, members, components, and/or groups thereof. It will be understood that, although the terms first, second, third etc. may be used herein to describe various members, components, regions, layers, and/or sections, these members, components, regions, layers, and/or sections should not be limited by these terms. These terms are only used to distinguish one member, component, region, layer, or section from another member, component, region, layer, or section. Thus, a first member, component, region, layer, or section discussed below could be termed a second member, component, region, layer, or section without departing from the teachings of example embodiments. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the drawings, like reference numerals denote like elements. Also, the thicknesses and relative sizes of layers may be exaggerated for clarity. For example, variations from the shapes of the illustrations as a result, for example, of manufacturing techniques and/or tolerances, are to be expected. Thus, example embodiments should not be construed as limited to the particular shapes illustrated herein.

FIG. 1 illustrates a top plan view of a semiconductor chip 100 according to an embodiment of the present concept.

Referring to FIG. 1, the semiconductor chip 100 may include a semiconductor layer 105, and may be divided into a first region 110 and a second region 115. For example, a memory cell, a logic cell, and the like may be located in the first region 110. For example, a peripheral circuit, an input/output (I/O) block, and the like may be located in the second region 115. A plurality of conductive pads 120 may be located in the second region 115 of the semiconductor chip 100. The conductive pads 120 may be used to input and output data signals of the semiconductor chip 100. For example, the conductive pads 120 may be used to test an integrated circuit in the semiconductor chip 100 or connect the integrated circuit to an external product.

Although the exemplary embodiment illustrated in FIG. 1 illustrates the second region 115 in which the conductive pads 120 are located being in the middle of the semiconductor chip 100 in FIG. 1, embodiments are not limited thereto. For example, the conductive pads 120 and/or the second region 115 may be disposed around edges of the semiconductor chip 100. Also, the conductive pads 120 may not be necessarily located in the second region 115. Although twenty-four conductive pads 120 are exemplarily shown in FIG. 1, embodiments are not limited thereto and the number of the conductive pads 120 may be appropriately determined according to the type and/or capacity of the semiconductor chip 100.

Figure 2:
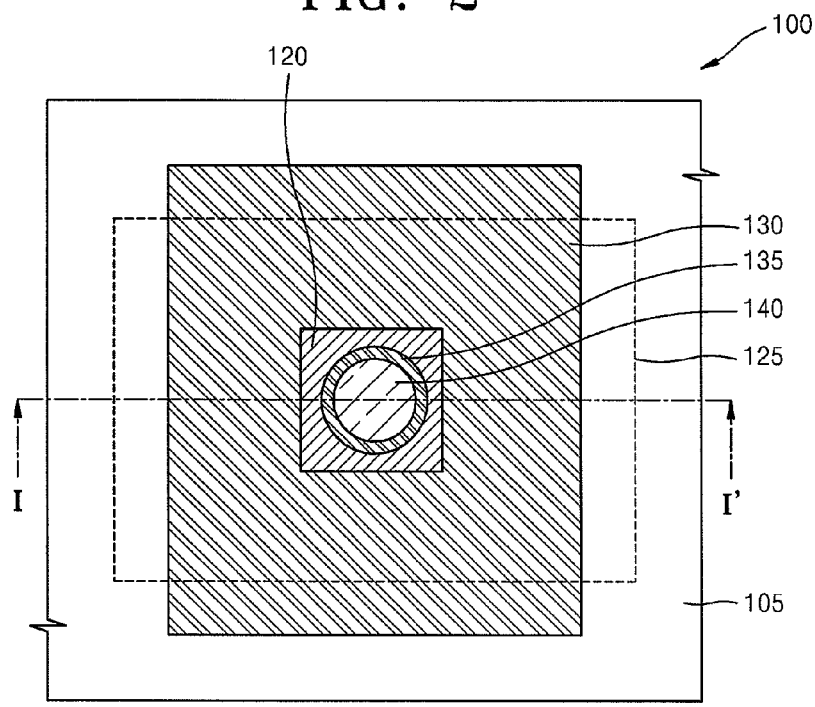
FIG. 2 illustrates a top plan view of a part of the semiconductor chip of FIG. 1.
Figure 3:
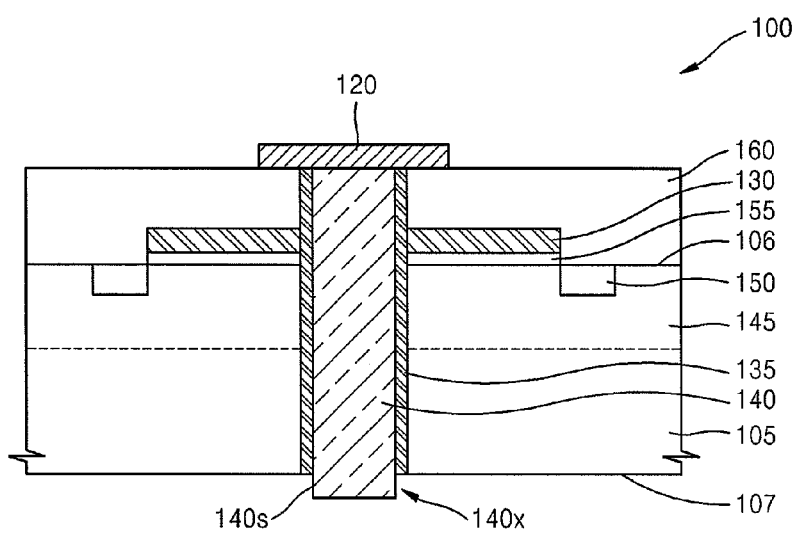
FIG. 3 illustrates a cross-sectional view of the part of the semiconductor chip of FIG. 2, taken along line I-I' of FIG. 2.

FIG. 2 illustrates a top plan view of a part of the semiconductor chip 100 of FIG. 1. FIG. 3 illustrates a cross-sectional view of the part of the semiconductor chip 100 illustrated in FIG. 2, taken along line I-I' of FIG. 2.

Referring to FIGS. 2 and 3, the semiconductor layer 105 may have a first surface 106, a second surface 107, and a TSV 140 passing through the semiconductor layer 105. More particularly, the TSV 140 may pass through the first surface 106 and the second surface 107 of the semiconductor layer 150. The first surface 106 and the second surface 107 may be opposite to each other. For example, the first surface 106 and the second surface 107 may be a front surface and a rear surface of the semiconductor layer 105, respectively. The semiconductor layer 105 may be a semiconductor wafer, and may include, for example, group IV materials or III-V compounds. The semiconductor layer 105 may be provided by grinding a rear surface of a semiconductor wafer to a predetermined thickness.

An active region 125 may be defined in the semiconductor layer 105 near the first surface 106 of the semiconductor layer 105. The active region 125 may be defined by a device isolation layer (not shown). The active region 125 may include source/drain regions 150 and a channel region disposed between the source/drain regions 150. The source/drain regions 150 may be regions doped with n-type or p-type impurities. The semiconductor layer 105 may include a well region 145 in which the source/drain regions 150 may be formed. The well region 145 may have conductivity opposite to that of the source/drain regions 150. However, if the conductivity of the semiconductor layer 105 is opposite to that of the source/drain regions 150, the well region 145 may be omitted.

A conductive layer 130 may be disposed above the first surface 106 of the semiconductor layer 105 and may be spaced apart from the first surface 106 of the semiconductor layer 105. The conductive layer 130 may cover the channel region of the active region 125 and a portion of the first surface 106 of the semiconductor layer 105. The conductive layer 130 may cover portions of the active region 125 other than portions where source/drain contact plugs (not shown) connected to the source/drain regions 150 of the active region 125 are to be formed. The conductive layer 130 may include, e.g., polysilicon doped with impurities or a metal such as tungsten (W) or aluminum (Al).

An insulating layer 155 may be provided between the first surface 106 of the semiconductor layer 105 and the conductive layer 130. The insulating layer 155 may separate and electrically insulate the first surface 106 of the semiconductor layer 105 from the conductive layer 130. At least a part of the insulating layer 155 may directly cover the channel region of the active region 125. The insulating layer 155 may include oxide, nitride, and/or oxynitride.

The active region 125 including the source/drain regions 150 and the channel region, and the insulating layer 155 and the conductive layer 130 may be sequentially stacked on the channel region of the active region 125, and may form one metal oxide semiconductor (MOS) transistor. Accordingly, since the conductive layer 130 may be a gate electrode of the MOS transistor, the conductive layer 130 may be referred to as a gate conductive layer 130, and the insulating layer 155 may be referred to as a gate insulating layer 155 below.

An insulating layer 160 may be provided on the first surface 106 of the semiconductor layer 105 to cover the gate conductive layer 130. Although one insulating layer 160 is illustrated in FIG. 2, embodiments are not limited thereto. For example, the insulating layer 160 may have a stacked structure including one or more of an oxide layer, a nitride layer, a low-k dielectric layer, and/or a high-k dielectric layer. Wiring patterns (not shown) having a multi-layer structure may be provided in the insulating layer 160. An integrated circuit (not shown) may also be provided in the insulating layer 160. The integrated circuit may vary according to the type of the semiconductor chip 100, and thus, for example, may include a memory circuit, a logic circuit, or a combination thereof. The insulating layer 160 may protect the integrated circuit from exposure to moisture.

Referring to FIGS. 2 and 3, the TSV 140 may pass through the semiconductor layer 105, the gate insulating layer 155, the gate conductive layer 130, and the insulating layer 160. Accordingly, the TSV 140 may be exposed from the second surface 107 of the semiconductor layer 105. As shown in FIG. 3, the TSV 140 may be exposed beyond the second surface 107 of the semiconductor chip 105 so as to be easily connected to an external product. Although the TSV 140 passes through the center of the gate conductive layer 130 in FIGS. 2 and 3, embodiments are not limited thereto. For example, the TSV 140 may pass through an edge of the gate conductive layer 130 except through the source/drain regions 150, or non-central parts of the gate conductive layer 130.

The TSV 140 may include at least one metal. For example, the TSV 140 may include a barrier metal and an interconnection metal. The barrier metal may have a stacked structure including, e.g., one or more of titanium (Ti), tantalum (Ta), titanium nitride (TiN), and/or tantalum nitride (TaN). The interconnection metal may have a stacked structure including, e.g., one or more of tungsten (W), aluminum (Al), and/or copper (Cu). However, embodiments are not limited to a specific material of the TSV 140.

A side wall insulating layer 135 may surround a side wall of the TSV 140.

The side wall insulating layer 135 may electrically insulate the semiconductor layer 105 and the gate conductive layer 130 from the TSV 140. The side wall insulating layer 135 may prevent the semiconductor layer 105, the gate conductive layer 130, and/or circuit elements in the insulating layer 160 from directly contacting the TSV 140. The side wall insulating layer 135 may expose a portion, e.g., a bottom portion 140e, of the TSV 140. In the exemplary embodiment illustrated in FIGS. 2 and 3, e.g., the side wall insulating layer 135 exposes a portion of a side wall 140s of the TSV 140 protruding beyond the second surface 107 of the semiconductor layer 105. The area of exposed portion 140x of the TSV 140 is large enough so that the TSV 140 may be easily connected to an external product.

A conductive pad 120 may be provided on the insulating layer 160, such that a top surface of the conductive pad 120 may be exposed. The conductive pad 120 may be electrically connected to the TSV 140. The conductive pad 120 may be used as an input/output terminal of the semiconductor chip 100. In the exemplary embodiment illustrated in FIGS. 2 and 3, the conductive pad 120 has a square plate-like shape and covers top surfaces of the side wall insulating layer 135 and the TSV 140. However, embodiments are not limited thereto. For example, the conductive pad 120 may be shaped in such a manner that the conductive pad 120 may be disposed on the insulating layer 160 and may have an opening through which the TSV 140 passes to directly expose the TSV 140 to the outside of the semiconductor chip 100. That is, the conductive pad 120 and the TSV 140 may be shaped like a washer and a nail passing through the washer, respectively. The conductive pad 120 may be different from the gate conductive layer 130 in that the conductive pad 120 may be electrically connected to the TSV 140 while the gate conductive layer 130 may be electrically isolated from the TSV 140. The conductive pad 120 and the TSV 140 may be connected to each other by wiring patterns (not shown) having a stacked structure which may be provided in the insulating layer 160. In this case, the conductive pad 120 may not be disposed over the TSV 140 but may be disposed in other places.

Figure 4:
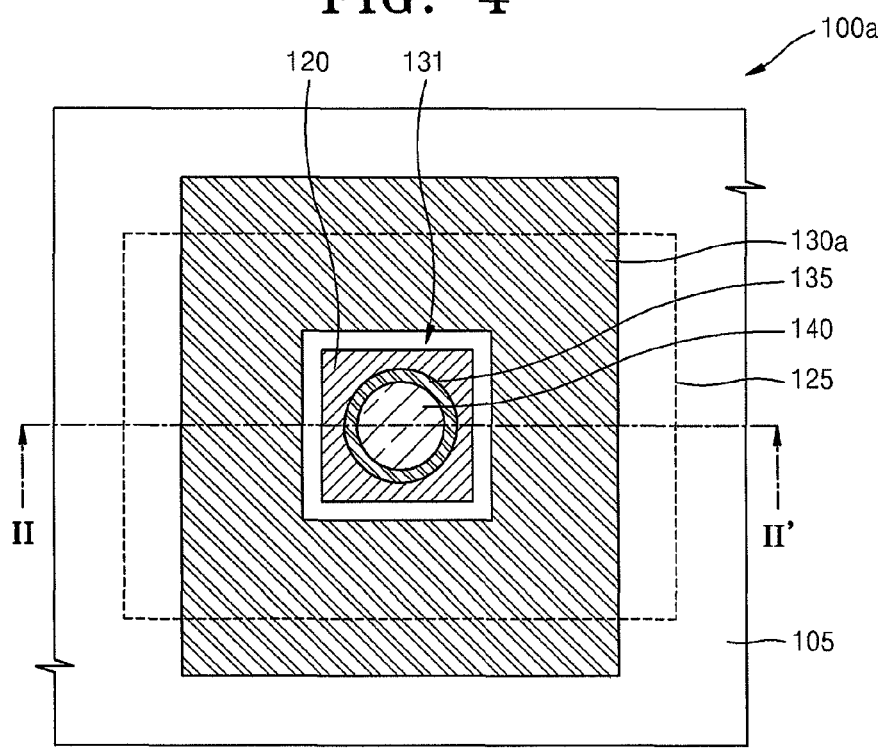
FIG. 4 illustrates a top plan view of the semiconductor chip according to another embodiment of the present concept.
Figure 5:
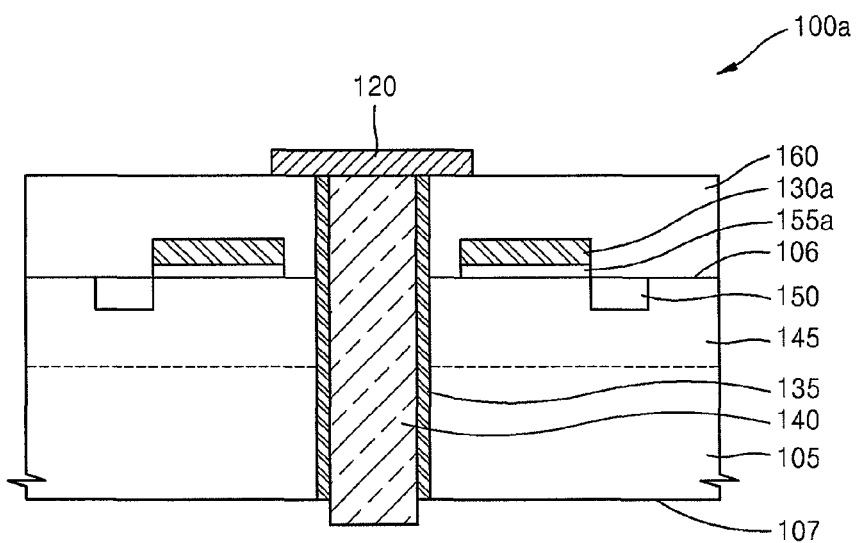
FIG. 5 illustrates a cross-sectional view taken along line II-II' of FIG. 4.

FIG. 4 illustrates a top plan view of the semiconductor chip 100a according to another embodiment of the present concept. FIG. 5 illustrates a cross-sectional view of the semiconductor chip 100a taken along line II-II' of FIG. 4. The semiconductor chip 100a of FIGS. 4 and 5 is a modification of the semiconductor chip 100 of FIGS. 2 and 3, and thus, in general, only differences between the exemplary embodiments of FIGS. 4 and 5 and the exemplary embodiment illustrated in FIGS. 2 and 3 will be described.

Referring to FIGS. 4 and 5, a gate conductive layer 130a may have an opening 131. An area of the opening 131 may be greater than a sum of a cross-sectional area of a TSV 140a and a cross-sectional area of the side wall of the side wall insulating layer 135 so that the TSV 140a and the side wall insulating layer 135 may pass through the opening 131 of the gate conductive layer 130a. Although the opening 131 has a square shape in FIG. 4, embodiments are not limited thereto and the opening 131 may have other shapes. A gate insulating layer 155a may also have the opening 131. The insulating layer 160 may fill the opening 131 of the gate conductive layer 130a so as to further electrically insulate the gate conductive layer 130a from the TSV 140a. However, as illustrated in FIGS. 2 and 3, the gate insulating layer 155a may not have the opening 131.

In the exemplary embodiment of FIGS. 4 and 5, the gate conductive layer 130a may be previously patterned to have the opening 131, e.g., patterned during original patterning of the gate conductive layer 130a. Thus, an etching process of removing a material of the gate conductive layer 130a may be omitted from a process of forming a hole for the TSV 140a. Accordingly, since the hole for the TSV 140a may be formed by etching only the insulating layer 160 and the semiconductor layer 105, processing time may be reduced.

Figure 6:
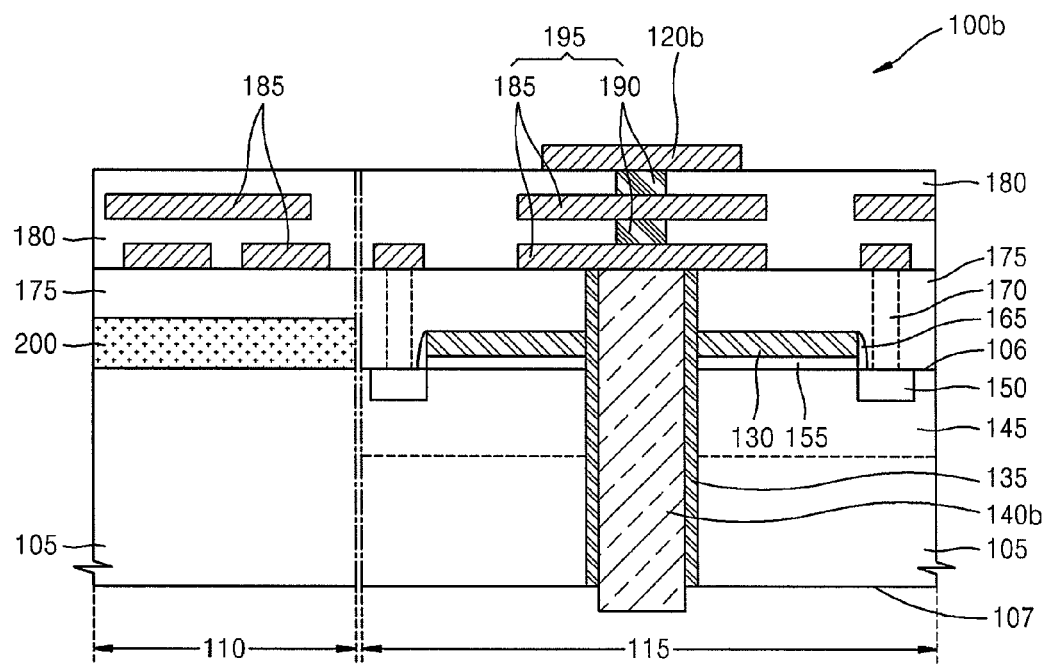
FIG. 6 illustrates a cross-sectional view of the semiconductor chip according to another embodiment of the present concept.

FIG. 6 illustrates a cross-sectional view of a semiconductor chip 100b according to another embodiment. In particular, FIG. 6 illustrates a cross-sectional view illustrating the first region 110 and the second region 115 of the semiconductor chip 100b. The semiconductor chip 100b of FIG. 6 is a modification of the semiconductor chip 100 of FIGS. 2 and 3, and thus, in general, only differences between the exemplary embodiments of FIG. 6 and the exemplary embodiment illustrated in FIGS. 2 and 3 will be described.

Referring to FIG. 6, an inter-layer insulating layer 175 through which a TSV 140b passes may be provided on the first surface 106 of the semiconductor layer 105 to cover the gate conductive layer 130. As will be explained later in detail, the inter-layer insulating layer 175 may separate circuit elements in an integrated circuit layer 200, and may separate circuit elements from a multi-layer wiring pattern 195. Although one inter-layer insulating layer 175 is illustrated in FIG. 6, embodiments are not limited thereto. For example, the inter-layer insulating layer 175 may have a stacked structure including one or more of, e.g., an oxide layer, a nitride layer, a low-k dielectric layer, and/or a high-k dielectric layer. The inter-layer insulating layer 175 may be included in the insulating layer 160 of FIG. 3.

Source/drain contact plugs 170 electrically connecting the source/drain regions 150 in the semiconductor layer 105 to a part of the multi-layer wiring pattern 195 may pass through the inter-layer insulating layer 175. Also, a gate electrode contact plug (not shown) electrically connecting the gate conductive layer 130 to a part of the multi-layer wiring pattern 195 may pass through the inter-layer insulating layer 175. In order to prevent the source/drain contact plugs 170 from being misaligned and connected to the gate conductive layer 130, a spacer 165 may be formed on side walls of the gate conductive layer 130 and the gate insulating layer 155.

The multi-layer wiring pattern 195 may be provided on the inter-layer insulating layer 175 to electrically connect the TSV 140b to a conductive pad 120b. The multi-layer wiring pattern 195 may include interconnection lines 185 and vertical plugs 190, which may be provided as one or more layers. The vertical plugs 190 may be vertically disposed on the semiconductor layer 105 to connect the interconnection lines 185. In the exemplary embodiment illustrated in FIG. 6, the interconnection lines 185 are a two-layer structure, however, embodiments are not limited thereto. Although the connection type of the interconnection lines 185 is exemplarily explained, embodiments are not limited thereto and the interconnection lines 185 may have various other connection types.

For example, each of the interconnection lines 185 may have a stacked structure including one or more interconnection metals such as, e.g., tungsten (W), aluminum (Al), and/or copper (Cu). The interconnection lines 185 and the vertical plugs 190 may include the same material or different materials. For example, for a damascene structure, the interconnection lines 185 and the vertical plugs 190 may include the same material. Each of the interconnection lines 185 and the vertical plugs 190 may further include one or more barrier metals in addition to the interconnection metals. However, embodiments are not limited to specific materials of the interconnection lines 185 and the vertical plugs 190.

A transistor including the gate conductive layer 130, the gate insulating layer 155, and the semiconductor layer 105 may be operated through the multi-layer wiring pattern 195 connected to the source/drain contact plugs 170 and the gate electrode contact plug (not shown). The multi-layer wiring pattern 195 may be used to form a predetermined circuit by appropriately connecting the circuit elements in the integrated circuit layer 200 and/or to connect the circuit elements in the integrated circuit layer 200 to an external product.

For example, if the source/drain regions 150 are p-type source/drain regions, the source/drain contact plugs 170 connected to the source/drain regions 150 may be connected to a power voltage source VDD through a part of the multi-layer wiring pattern 195, and the gate electrode contact plug connected to the gate conductive layer 130 may be connected to a ground voltage source VSS through another part of the multi-layer wiring pattern 195. On the contrary, if the source/drain regions 150 are n-type source/drain regions, the source/drain contact plugs 170 connected to the source/drain regions 150 may be connected to the ground voltage source VSS through a part of the multi-layer wiring pattern 195, and the gate electrode contact plug connected to the gate conductive layer 130 may be connected to the power voltage source VDD through another part of the multi-layer wiring pattern 195. Accordingly, the transistor including the gate conductive layer 130, the gate insulating layer 155, and the semiconductor layer 105 may operate as a decoupling capacitor, so as to apply stable power to integrated devices of the semiconductor chip 100. Since the decoupling capacitor may also be disposed in a region where the TSV 140 is to be disposed, the decoupling capacitor may have a capacitance greater than would be the case if the decoupling capacitor is not disposed in the region where the TSV 140 is disposed.

An inter-metal insulating layer 180 may be provided on the inter-layer insulating layer 175 to cover the multi-layer wiring pattern 195. The inter-metal insulating layer 180 may separate and insulate the interconnection lines 185. Although one inter-metal insulating layer 180 is illustrated in FIG. 6, embodiments are not limited thereto and the inter-metal insulating layer 180 may include a plurality of insulating layers. For example, the inter-metal insulating layer 180 may be provided as a plurality of layers in accordance with the interconnection lines 185. The inter-metal insulating layer 180 may be included in the insulating layer 160 of FIG. 3.

The conductive pad 120b disposed on the inter-metal insulating layer 180 may be connected to the TSV 140 through a part of the multi-layer wiring pattern 195. Although a connection relationship is not shown in FIG. 6, the conductive pad 120b may be connected to the circuit elements in the integrated circuit layer 200 through another part of the multi-layer wiring pattern 195. Accordingly, signals of the circuit elements may be applied to the conductive pad 120b through a respective part of the multi-layer wiring pattern 195, and may be applied to the TSV 140 through the respective part of the multi-layer wiring pattern 195.

In FIG. 6, the inter-metal insulating layer 180 and the inter-layer insulating layer 175 may perform separate functions. The inter-layer insulating layer 175 may be an insulating layer between the semiconductor layer 105 and a lowermost interconnection line of the interconnection lines 185, whereas the inter-metal insulating layer 180 may be an insulating layer between the conductive pad 120b and the inter-layer insulating layer 175. A passivation layer (not shown) through which the conductive pad 120 is exposed may be further provided on the inter-metal insulating layer 180.

In the exemplary embodiment of FIG. 6, the TSV 140b is connected to the conductive pad 120b through the multi-layer wiring pattern 195. Referring to FIG. 6, in such embodiments, the TSV 140b may not pass through the conductive pad 120b and the multi-layer wiring pattern 195. In particular, since the TSV 140b may directly contact a bottom surface of the multi-layer wiring pattern 195, the reliability of contact between the TSV 140b and the conductive pad 120b may be increased. Accordingly, reliability of the semiconductor chip 100 may be increased, and a number of tests conducted on the semiconductor chip 100 may be reduced.

Referring to the first region 110 of FIG. 6, the integrated circuit layer 200 may be provided on the first surface 106 of the semiconductor layer 105. The integrated circuit layer 200 may include the circuit elements, e.g., transistors and/or capacitors, according to the type of the semiconductor chip 100b. According to the structure of the integrated circuit layer 200, the semiconductor chip 100b may function as a memory device or a logic device. Examples of the memory device may include a dynamic random access memory (DRAM), static RAM (SRAM), flash memory, electrically erasable and programmable read only memory (EEPROM), phase-change RAM (PRAM), magnetoresistive RAM (MRAM), and resistive RAM (RRAM). The structure of these semiconductor devices does not limit the scope of the present concept. The integrated circuit layer 200 of a DRAM and a flash memory will now be exemplarily explained with reference to FIGS. 7 and 8, respectively.

Figure 7:
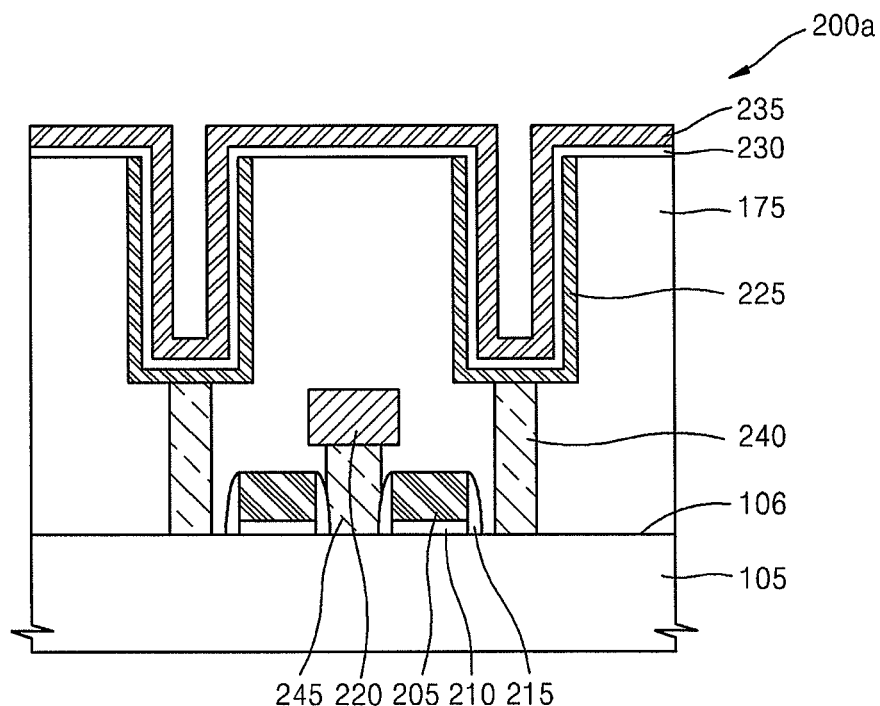
FIG. 7 illustrates a cross-sectional view of an integrated circuit layer of a dynamic random access memory (DRAM), according to an embodiment of the present concept.

FIG. 7 illustrates a cross-sectional view of an integrated circuit layer 200a of an exemplary DRAM, according to an embodiment of the present concept. Referring to FIG. 7, gate electrodes 205 may be provided on the first surface 106 of the semiconductor layer 105, and may be used as word lines of transistors. A gate insulating layer 210 may be provided between the gate electrodes 205 and the first surface 106 of the semiconductor layer 105. At least one bit line 220 may be provided on the semiconductor layer 105 to be connected to a drain region (not shown), which is defined in the semiconductor layer 105, through a bit line contact plug 245. Spacers 215 may be provided on side walls of the gate insulating layer 210 and the gate electrodes 205 for the purpose of self-alignment and protection of the gate electrodes 205. Storage lower electrodes 225 may be provided on the semiconductor layer 105 and may be connected to source regions (not shown), which are defined in the semiconductor layer 105, through a storage contact plug 240. A dielectric layer 230 may be provided on the storage lower electrodes 225, and a storage upper electrode 235 may be provided on the dielectric layer 230. The inter-layer insulating layer 175 may cover the above elements. The gate insulating layer 210 in the first region 110 may include the same material as the gate insulating layer 155 in the second region 115 and may be manufactured by the same process as that used for the gate insulating layer 155. The gate electrodes 205 in the first region 110 may include the same material as the gate conductive layer 130 in the second region 115, and may be manufactured by the same process as that used for the gate conductive layer 130.

Figure 8:
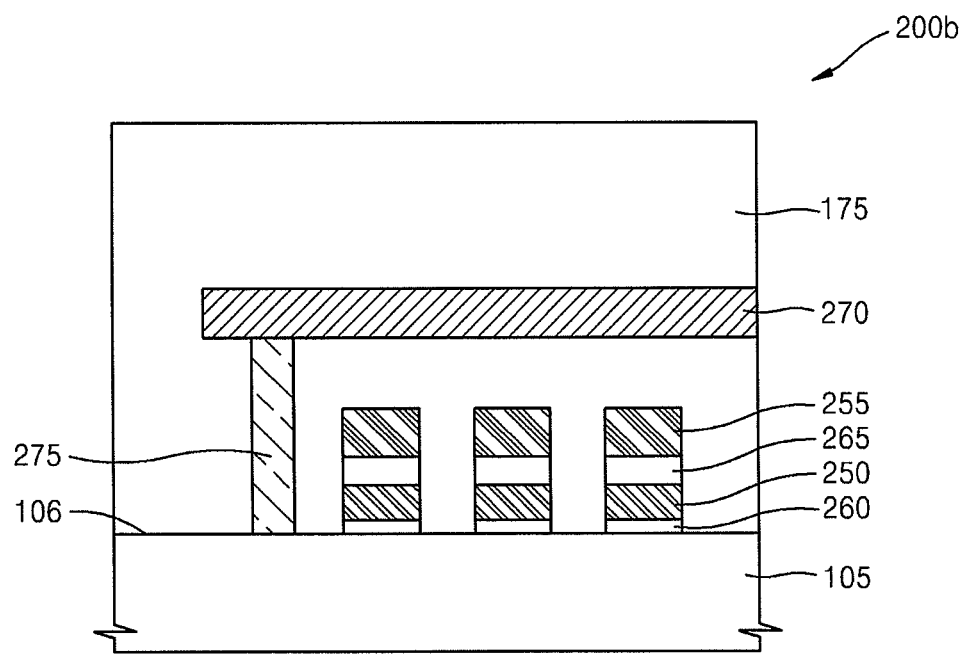
FIG. 8 illustrates a cross-sectional view of the integrated circuit layer of a flash memory, according to another embodiment of the present concept.

FIG. 8 illustrates a cross-sectional view of the integrated circuit layer 200b of a flash memory, according to another embodiment of the present concept. Referring to FIG. 8, charge storage layers 250 may be provided on the first surface 106 of the semiconductor layer 105. Tunneling insulating layers 260 may be provided between the first surface 106 of the semiconductor layer 105 and the charge storage layers 250. Control gate electrodes 255 may be stacked on the charge storage layers 250. Blocking insulating layers 265 may be provided between the charge storage layers 250 and the control gate electrodes 255. The control gate electrodes 255 may be used as word lines of memory transistors. At least one bit line 270 may be provided over the semiconductor layer 105 and may be connected to a drain region (not shown), which is defined in the semiconductor layer 105, through a bit line contact plug 275. The control gate electrodes 255 in the first region 110 may include the same material as the gate conductive layer 130 in the second region 115 and may be manufactured by the same process as that used for the gate conductive layer 130.

FIGS. 9A, 9B, 9C, 9D, and 9E illustrate cross-sectional views of semiconductor chips 100c, 100d, 100e, 100f, and 100g according to other exemplary embodiments of the present concept. The semiconductor chips 100c, 100d, 100e, 100f, and 100g illustrated in FIGS. 9A, 9B, 9C, 9D, and 9E are modifications of the aforesaid semiconductor chip 100a of FIGS. 2 and 3, and thus a repeated explanation thereof will not be given. In general, only differences between the exemplary embodiments of FIGS. 9A, 9B, 9C, 9D, and 9E and the exemplary embodiment illustrated in FIGS. 2 and 3 will be described.

Figure 9A:
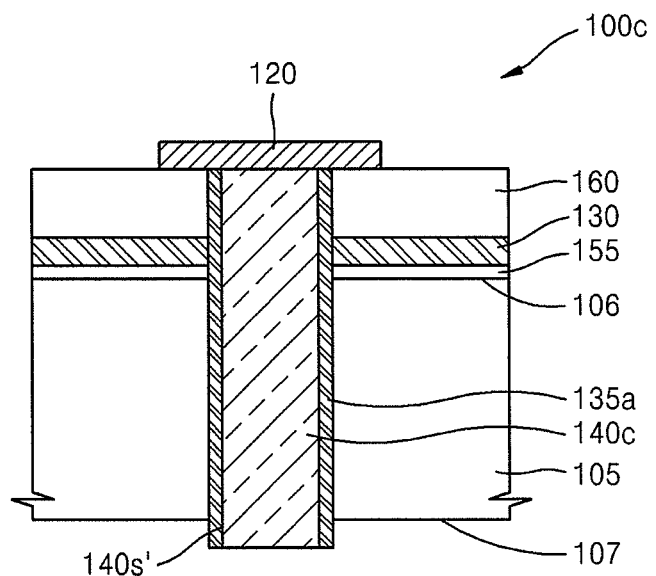
FIGS. 9A through 9E illustrate cross-sectional views of semiconductor chips according to other embodiments of the present concept.

Referring to FIG. 9A, a side wall insulating layer 135a may further surround a side wall 140s' of a portion of a TSV 140c protruding beyond the second surface 207. Accordingly, only a bottom surface of the TSV 140 may be exposed from the side wall insulating layer 135a.

Figure 9B:
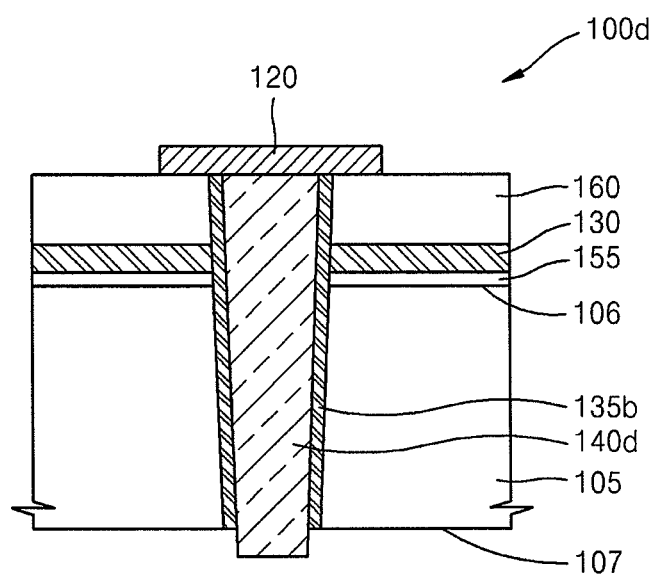

Referring to FIG. 9B, a TSV 140d may have a tapered shape toward the second surface 107. In such embodiments, an aspect ratio of a groove for forming the TSV 140b may be reduced. Thus, the TSV 140b may be more uniformly formed. A side wall insulating layer 135b may also have a cylindrical shape which is tapered toward the second surface 107.

Figure 9C:
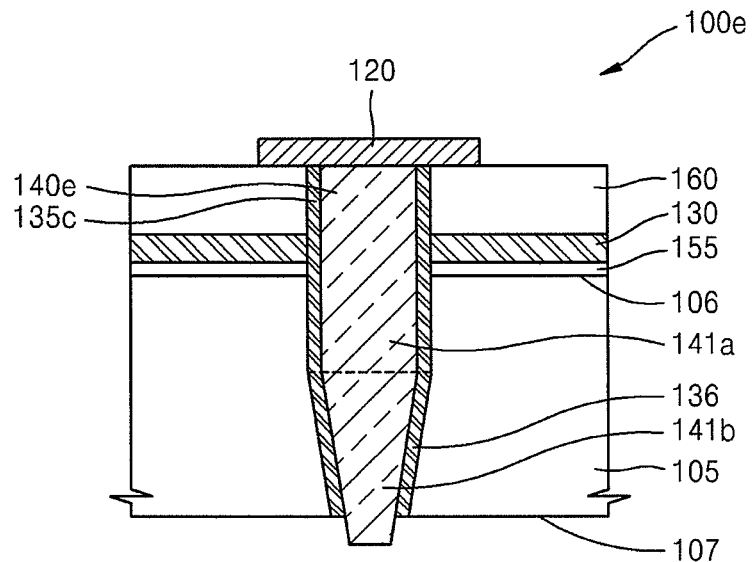

Referring to FIG. 9C, a TSV 140e may include a first portion 141a having a constant width and a second portion 141b having a tapered shape toward the second surface 107. In such embodiments, a void or an undercut is not formed in the middle portion or the bottom of the second portion 141b and an increase in the electrical resistance of the TSV 140c can be prevented due to a constant width of the first portion. A side wall insulating layer 135c may also include a first portion having a constant width and a second portion having a cylindrical shape which is tapered toward the second surface 107.

Figure 9D:
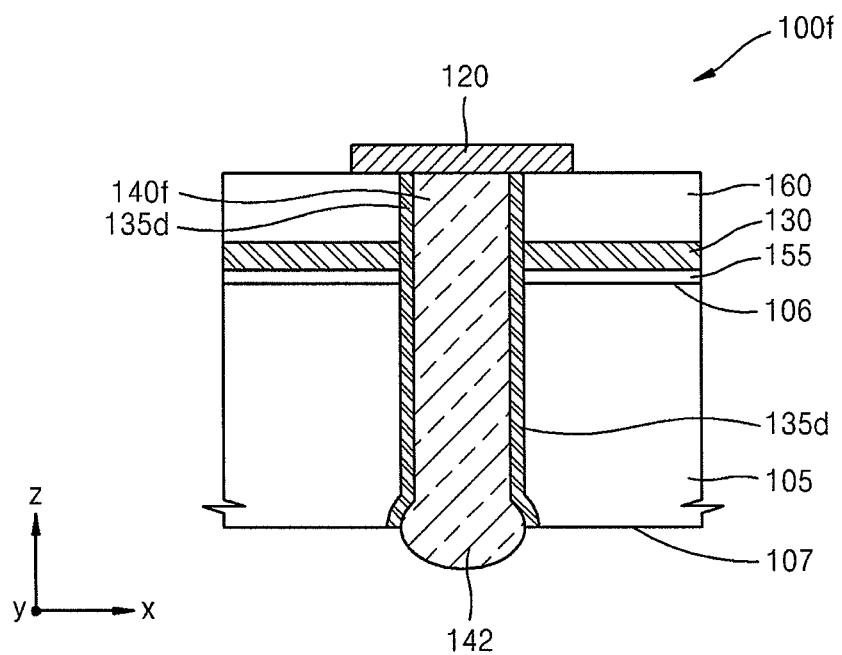

Referring to FIG. 9D, a TSV 140f may include a conductive tap 142 formed at an end of the TSV 140f where the TSV 140f meets the second surface 107. The conductive tap 142 may extend in a width direction, e.g., x and/or y-direction, of the TSV 140f, to increase the width of the TSV 140f. Accordingly, an area of a portion of the TSV 140f exposed from the second surface 107 may be greater than the area of a portion of the TSV 140d exposed from the first surface 106. Accordingly, although the width of the TSV 140d may decrease as a size of a semiconductor chip 100d decreases, a contact area with an external product may be maintained and/or increased. A sidewall insulating layer 135d may correspond to the shape of the TSV 140d.

Figure 9E:
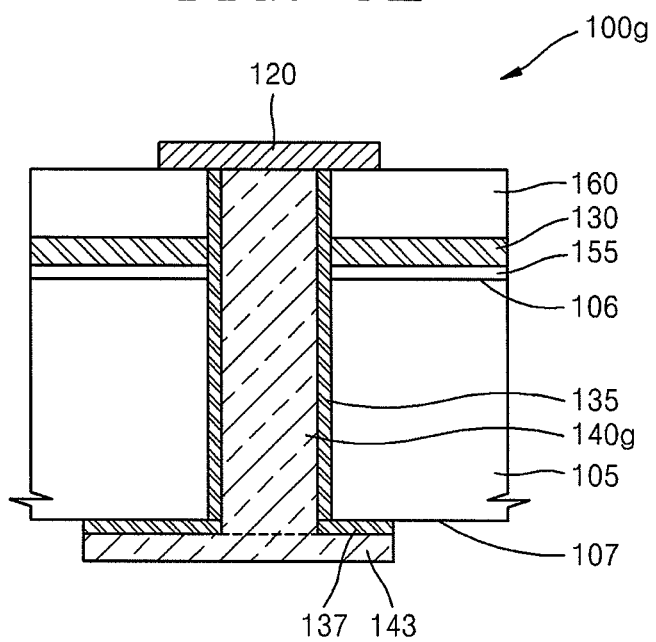

Referring to FIG. 9E, a redistribution wiring layer 143 may be further provided to extend a TSV 140g beyond the second surface 107. An insulating layer 137 may be interposed between the redistribution wiring layer 143 and the second surface 107. The redistribution wiring layer 143 may help to easily connect the TSV 140g to an external terminal or an external product. A redistribution line (not shown) for redistributing the conductive pad 120 may be further provided on the first surface 106 along with or separately from the redistribution wiring layer 143. Accordingly, the TSV 140g may be formed without being limited, by the location of the conductive pad 120. Accordingly, a position where the TSV 140g is to be formed may be appropriately determined in the semiconductor chip 100g.

The semiconductor chips 100c through 100g of FIGS. 9A through 9E have been exemplarily explained. Although source/drain regions are not illustrated and a multi-layer wiring pattern is not illustrated on the insulating layer 160 in FIGS. 9A through 9E for clarity and convenience, embodiments are not limited thereto.

Figure 10:
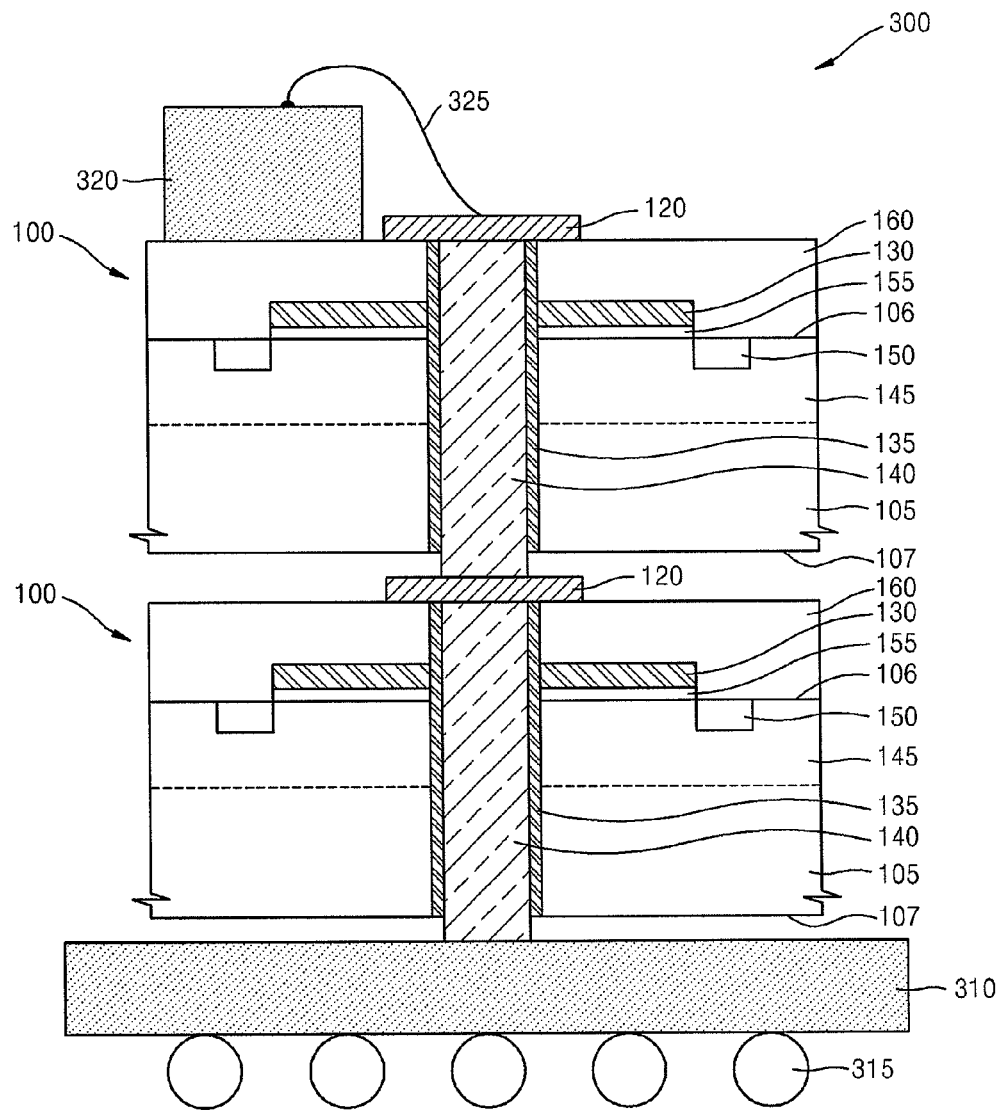
FIG. 10 illustrates a cross-sectional view of a stack module according to an embodiment of the present concept.

FIG. 10 illustrates a cross-sectional view of a stack module 300a according to an embodiment of the present concept. In the exemplary embodiment of FIG. 10, the exemplary semiconductor chip 100 is employed, however, embodiments are not limited thereto.

Referring to FIG. 10, one or more first semiconductor chips 100 may be stacked on a module substrate 310. As shown in FIG. 10, a plurality of first semiconductor chips 100 may be stacked on the module substrate 310, and a second semiconductor chip 320 may be stacked on an uppermost first semiconductor chip of the plurality of first semiconductor chips 100. The first semiconductor chips 100 may be disposed in such a manner that the second surfaces 107 face the module substrate 310. Accordingly, the TSV 140 of a lower first semiconductor chip 100 may be connected to a conductive pad (not shown) of the module substrate 310, and the TSV 140 of an upper first semiconductor chip 100 may be connected to the conductive pad 120 of the lower first semiconductor chip 100. The number of first semiconductor chips that may be stacked on the module substrate 310 may vary without departing from the teachings of the present concept.

The module substrate 310 may include a printed circuit board including a circuit interconnection. The module substrate 310 may also include a TSV like the first semiconductor chips 100. The module substrate 310 may include an integrated circuit that is different in type from the first semiconductor chips 100, and may have a size that is different from that of the first semiconductor chips 100. For example, when the first semiconductor chips 100 include memory devices and the module substrate 310 includes a logic integrated circuit, the stack module 300 may constitute one system in package (SiP).

The second semiconductor chip 320 may include an integrated circuit which is different in type from the first semiconductor chip 100. For example, the first semiconductor chips 100 may include DRAM devices, and the second semiconductor chip 320 may include a flash memory device. The second semiconductor chip 320 may not include a TSV, unlike the first semiconductor chips 100. The second semiconductor chip 320 may be connected to the first semiconductor chips 100 through, e.g., a bonding wire 325. More particularly, e.g., the bonding wire 325 may be connected to the conductive pad 120 of the uppermost first semiconductor chip of the first semiconductor chips 100.

An external terminal 315 may be attached to a bottom surface of the module substrate 310. The external terminal 315 may be used to connect the stack module 300 to an external product. For example, the external terminal 315 may include solder balls or bumps.

Although not shown in FIG. 10, an appropriate adhesive member or flux (not shown) may be interposed between the first semiconductor chips 100 and the second semiconductor chip 320. The first semiconductor chips 100 may be modified into any one of the semiconductor chips 100, and 100a through 100g of FIGS. 4 through 6, and FIGS. 9A through 9E.

Figure 11:
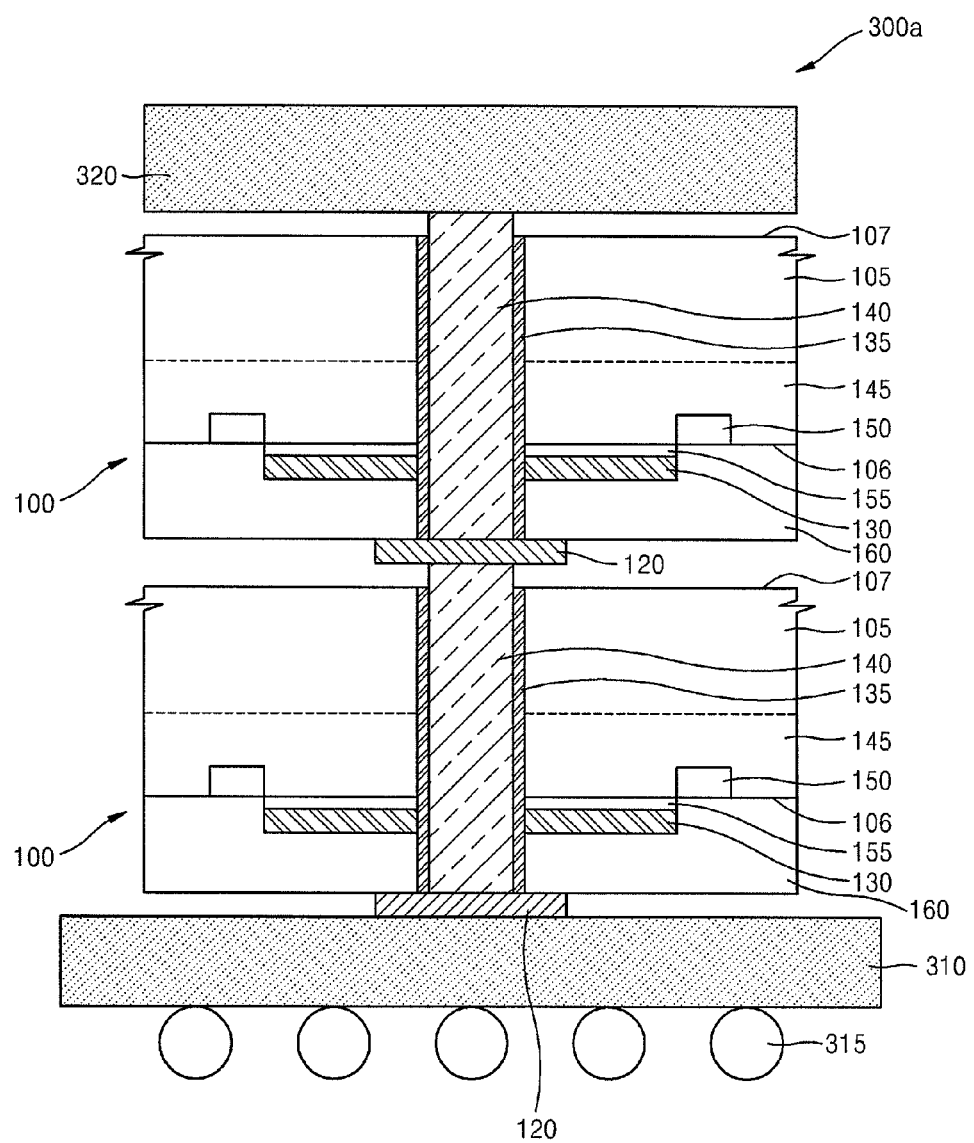
FIG. 11 illustrates a cross-sectional view of the stack module according to another embodiment of the present concept.

FIG. 11 illustrates a cross-sectional view of a stack module 300a according to another embodiment of the present concept. The stack module 300a of FIG. 11 is a modification of the stack module 300 of FIG. 10, and thus, in general, only differences between the stack module 300 of FIG. 10 and the stack module 300a of FIG. 11 will be described below.

The second surfaces 107 of the first semiconductor chips 100 may face the second semiconductor chip 320 that is disposed over an uppermost first semiconductor chip of the first semiconductor chips 100. That is, the semiconductor chip 100 of FIG. 3 may be turned over and then disposed on the module substrate 310. Accordingly, the TSV 140 of a lower first semiconductor chip 100 may be connected to the conductive pad 120 of an upper first semiconductor chip 100. The conductive pad 120 of the lower first semiconductor chip 100 may be connected to the circuit interconnection of the module substrate 310.

The second semiconductor chip 320 may include a TSV and a conductive pad connected to the TSV, like the first semiconductor chips 100. Accordingly, the TSV and the conductive pad of the second semiconductor chip 320 may be electrically connected to the TSV 140 of the uppermost first semiconductor chip of the first semiconductor chips 100.

Although not shown in FIG. 11, an appropriate adhesive member or flux (not shown) may be interposed between the module substrate 310, the first semiconductor chips 100, and the second semiconductor chip 320. The first semiconductor chips 100 of FIG. 11 may be modified into any one of the semiconductor chips 100 and 100a through 100g of FIGS. 4 through 6 and 9A through 9E.

FIGS. 12A through 12F are cross-sectional views illustrating a method of fabricating the semiconductor chip 100b of FIG. 6, according to an embodiment of the present concept.

Figure 12A:
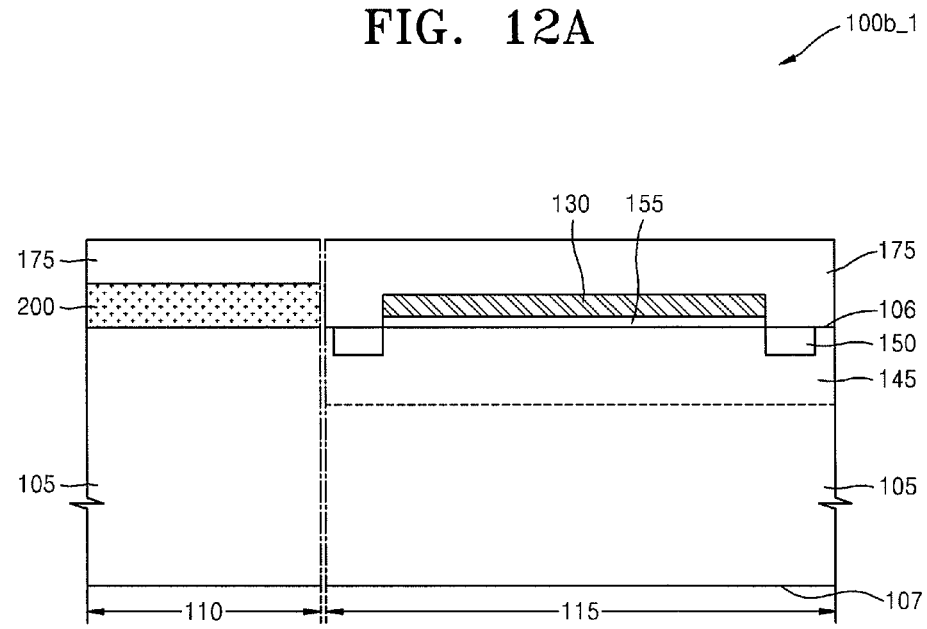
FIGS. 12A through 12F illustrate cross-sectional views illustrating a method of fabricating a semiconductor chip, according to an embodiment of the present concept.

Referring to FIG. 12A, in the first region 110, the integrated circuit layer 200 may be formed on the first surface 106 of the semiconductor layer 105, and the inter-layer insulating layer 175 may be formed on the integrated circuit layer 200. The integrated circuit layer 200 has been already explained above with reference to FIGS. 7 and 8. The integrated circuit layer 200 may be formed by a typical process of forming an appropriate circuit element, e.g., a transistor and/or a capacitor.

In the second region 115, the semiconductor layer 105 including the well region 145 may be provided. A channel region adjacent to the first surface 106 may be defined in the well region 145 of the semiconductor layer 105.

In the second region 115, the gate insulating layer 155 may be formed on the first surface 106 of the semiconductor layer 105 to cover the channel region. The gate insulating layer 155 may be, e.g., a silicon oxide layer, a silicon nitride layer, or a silicon oxynitride layer. The gate insulating layer 155 may have a multi-layer structure including, e.g., a silicon oxide layer and a silicon nitride layer, or may be a silicon oxide layer having a surface that is nitrided. The gate insulating layer 155 may be formed by various methods such as thermal oxidation, rapid thermal oxidation (RTO), chemical vapor deposition (CVD), plasma enhanced CVD (PECVD), high density plasma CVD (HDP-CVD), digital CVD, pulsed CVD, atomic layer deposition (ALD), and sputtering. More particularly, e.g., in embodiments in which the integrated circuit layer is a DRAM as shown in FIG. 7, the gate insulating layer 155 may be simultaneously formed with the gate insulating layer 210 of the integrated circuit layer 200a.

In the second region 115, the gate conductive layer 130 may be formed on the gate insulating layer 155. The gate conductive layer 130 may be formed by CVD, PECVD, HDP-CVD, sputtering, metal organic CVD (MOCVD), or ALD. The gate conductive layer 130 may include, e.g., at least one of polysilicon and a metal such as aluminum (Al), copper (Cu), and/or tungsten (W). More particularly, e.g., in embodiments in which the integrated circuit layer is a DRAM as shown, e.g., in FIG. 7, the gate conductive layer 130 may be simultaneously formed with the gate electrodes 205 of the integrated circuit layer 200a. In embodiments in which the integrated circuit layer is a flash memory as shown, e.g., in FIG. 8, the gate conductive layer 130 may be simultaneously formed with the control gate electrodes 255 if the integrated circuit layer 200b.

In embodiments in which the opening 131 is formed as described above with regard to FIGS. 4 and 5, the gate insulating layer 155 and the gate conductive layer 130 may be patterned by photolithography to form the opening 131 at a position corresponding to where the TSV 140b' is to be formed.

In the second region 115, the source/drain regions 150 may be formed in the well region 145 of the semiconductor layer 105 on both sides of the gate insulating layer 155 and the gate conductive layer 130. The source/drain regions 150 may be formed by ion implantation in which n-type or p-type impurities are implanted according to the type of a target transistor. Before the ion implantation, a spacer may be formed on side walls of the gate insulating layer 155 and the gate conductive layer 130. Even in the second region 115, the inter-layer insulating layer 175 may be formed on the first surface 106 of the semiconductor layer 105 to cover the gate conductive layer 130.

In the first region 110 and the second region 115, the inter-layer insulating layer 175 may be formed by an appropriate deposition method such as CVD. Since the inter-layer insulating layer 175 may not be smooth due to the profile of the integrated circuit layer (200), the inter-layer insulating layer 175 may be planarized after the deposition. The inter-layer insulating layer 175 may be planarized by chemical mechanical polishing (CMP) or etch-back. The inter-layer insulating layer 175 may be planarized to a thickness that is coincident with the height of the TSV 140b' as shown in FIG. 12C as will be described later.

Figure 12B:
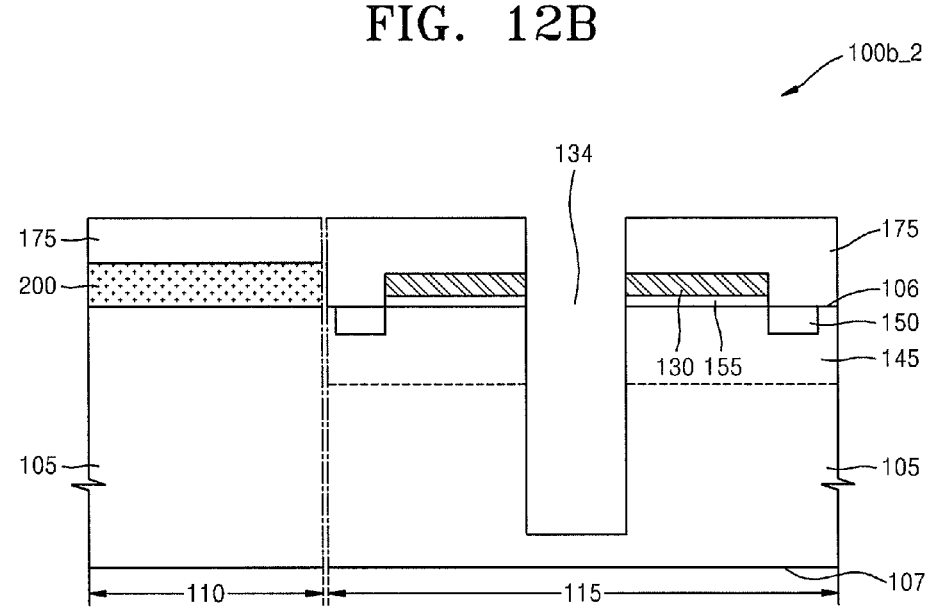
Figure 12C:
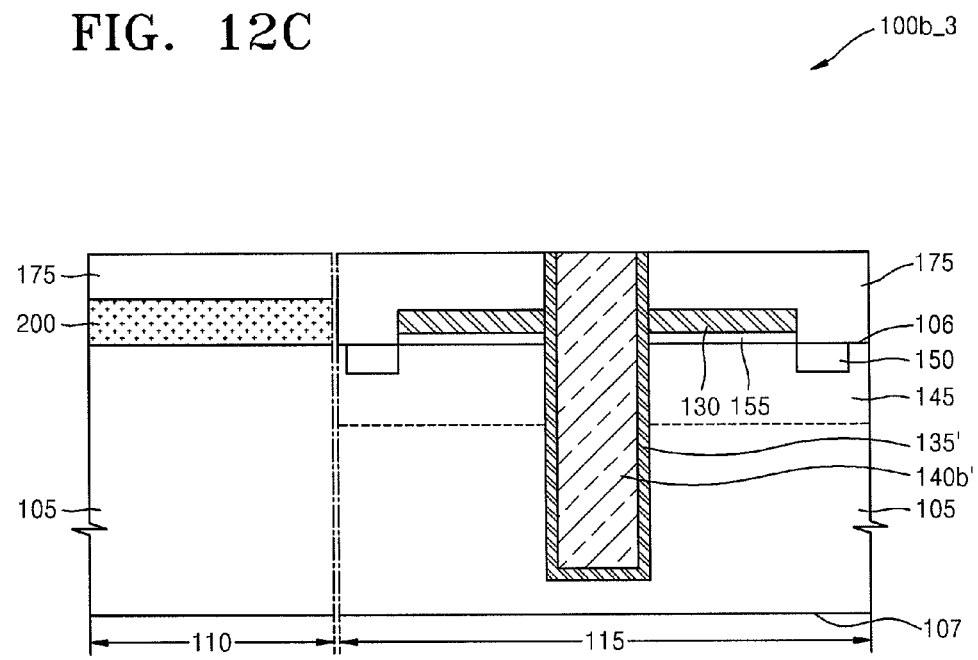

Referring to FIG. 12B, a resist pattern (not shown) may be formed on the inter-layer insulating layer 175. Next, a groove 134 may be formed by continuously removing the inter-layer insulating layer 175, the gate conductive layer 130, the gate insulating layer 155, and the semiconductor layer 105 by using the resist pattern. Accordingly, the groove 134 may be cut into the semiconductor layer 105 by passing through the inter-layer insulating layer 175, the gate conductive layer 130, and the gate insulating layer 155. In embodiments in which the opening 131 (see FIGS. 4 and 5) is already formed in a position where the TSV 140 is to be formed, the groove 134 may be formed only by continuously removing the inter-layer insulating layer 175 and the semiconductor layer 105, thereby omitting an etching process of removing the gate conductive layer 130.

For example, the groove 134 may be formed by laser drilling and/or dry etching. Since laser drilling allows focus adjustment, laser may be selectively emitted to a position where the groove 134 is to be formed without a resist pattern. However, dry etching may use a resist pattern as an etch mask. Since a multi-layer wiring pattern does not need to be etched in order to form the groove 134 in FIG. 12B, the groove 134 may be formed to have a relatively continuous profile.

Since the semiconductor layer 105 may be grinded, the groove 134 may not pass through the semiconductor layer 105. However, in other embodiments, the groove 134 may pass through the semiconductor layer 105.

The groove 134 may have various shapes according to etching or drilling conditions. For example, the groove 134 may have a relatively uniform cylindrical shape, or may have a tapered shape as shown in FIG. 9B. Alternatively, the groove 134 may have a first portion having a uniform cylindrical shape and a second portion having a tapered shape as shown in FIG. 9C.

Referring to FIG. 12C, a side wall insulating layer 135' may be formed in the groove 134. For example, the side wall insulating layer 135' may include an appropriate insulating layer, such as an oxide layer, a nitride layer, polymer, or parylene, and may be formed by low-temperature deposition such as low-temperature CVD, polymer spraying, or low-temperature PVD.

Next, the TSV 140b' may be formed on the side wall insulating layer 135'. For example, the TSV 140b' may include an appropriate conductive layer, such as a barrier metal and an interconnection metal. The barrier metal may have a stacked structure including one or more of, e.g., titanium (Ti), tantalum (Ta), titanium nitride (TiN), and/or tantalum nitride (TaN). The interconnection metal may have a stacked structure including, e.g., one or of tungsten (W), aluminum (Al), and/or copper (Cu). If the interconnection metal includes copper (Cu), plating may be used. In this case, a Cu-plating layer may be formed after a Cu seed layer is first formed.

After the TSV 140b' fills the groove 134, the TSV 140b' may be planarized. For example, the TSV 140b' may be planarized by CMP or etch-back to remain only in the groove 134. When the TSV 140b' is planarized, the inter-layer insulating layer 175 may also be planarized.

In FIG. 12C, since the profile of the groove 134 is continuous and uniform, the TSV 140b' can be easily formed. This is because if the profile of the groove 134 is not uniform, it may be difficult to uniformly fill the barrier metal and the interconnection metal. In particular, since the barrier metal is often formed by PVD that is poor at coating edges, it is very difficult to uniformly fill the groove with a non-uniform profile.

Figure 12D:
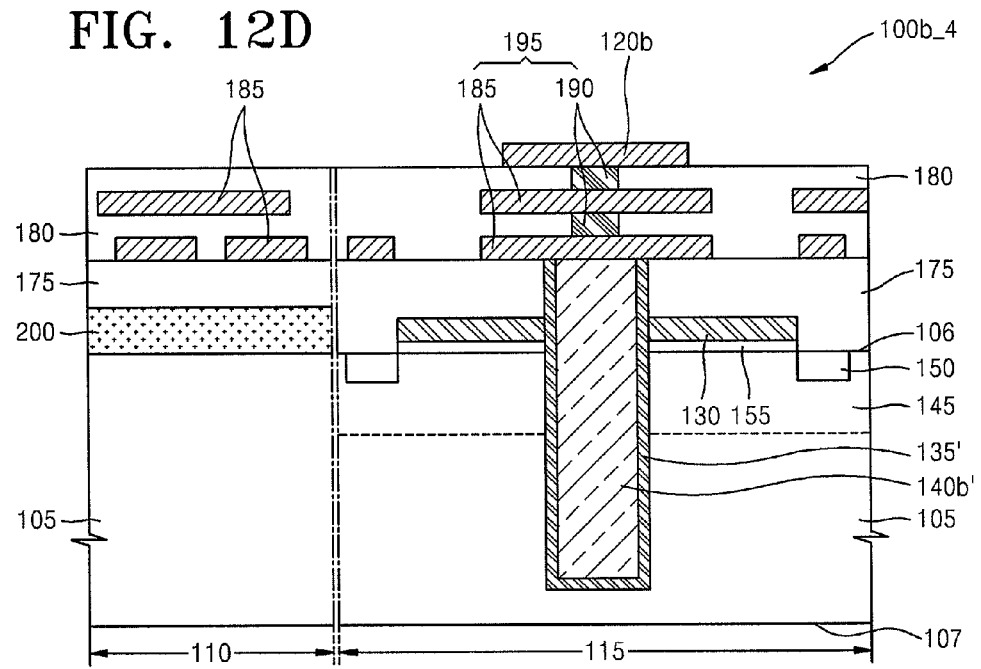

Referring to FIG. 12D, the inter-metal insulating layer 180 and the multi-layer wiring pattern 195 connected to the TSV 140b' may be formed. For example, the multi-layer wiring pattern 195 may be formed by repeatedly stacking the interconnection lines 185 and the vertical plugs 190. The inter-metal insulating layer 180 may be repeatedly formed before the vertical plugs 190 are formed, and thus the inter-metal insulating layer 180 may have a multi-layer structure.

The multi-layer wiring pattern 195 may be formed by material layer deposition and patterning, or a damascene process. For example, the former is preferred if the multi-layer wiring pattern 195 includes aluminum (Al) and/or tungsten (W), and the latter is preferred if the multi-layer wiring pattern 195 includes copper (Cu).

The conductive pad 120b connected to the multi-layer wiring pattern 195 may be formed on the inter-metal insulating layer 180.

Figure 12E:
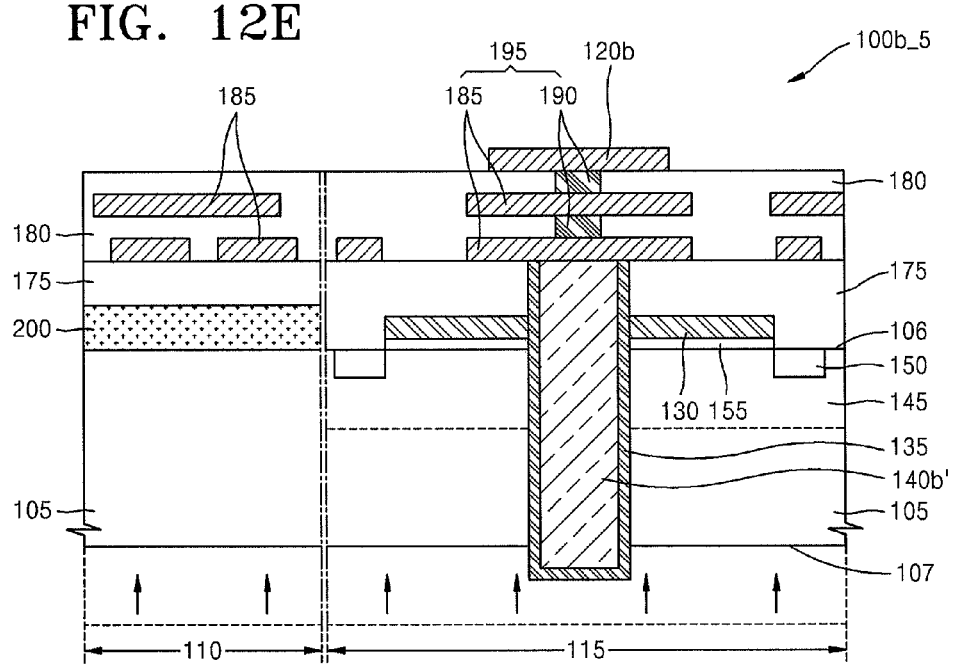

Referring to FIG. 12E, the TSV 140b' surrounded by the side wall insulating layer 135 may be exposed from the semiconductor layer 105 by removing a thickness portion of the semiconductor layer 105. For example, the TSV 140 may protrude beyond the second surface 107 by cutting the second surface 107 of the semiconductor layer 105 to a level deeper than a bottom surface of the TSV 140.

The semiconductor layer 105 may be removed by CMP, isotropic etching, anisotropic etching, or a combination thereof. For example, a great amount of the semiconductor layer 105 may be removed by CMP and then the semiconductor layer 105 may be cut by isotropic etching, e.g., wet etching, to a position deeper than the bottom surface of the TSV 140b.

Figure 12F:
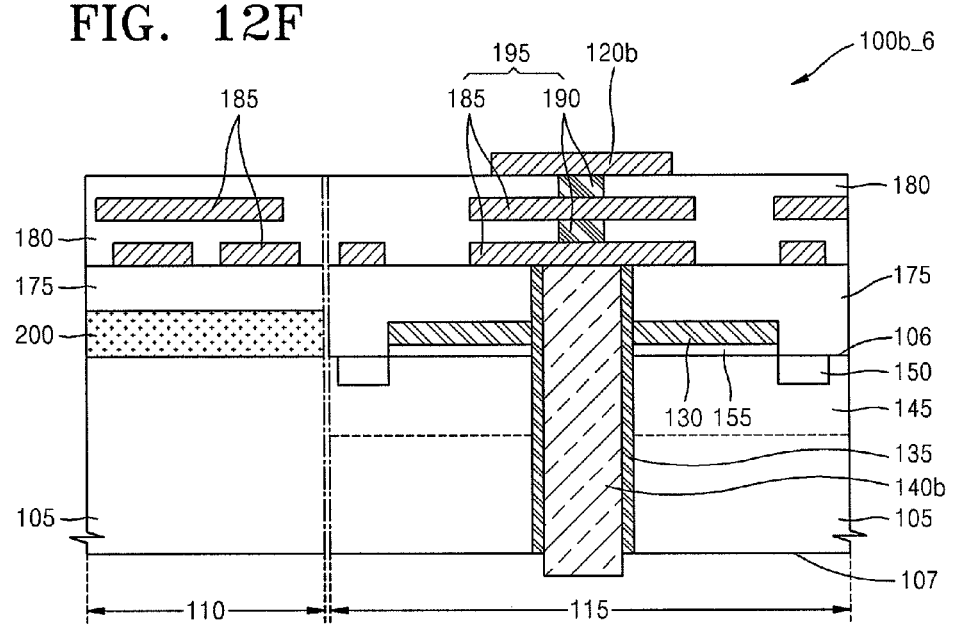

Referring to FIG. 12F, a portion of the side wall insulating layer 135' surrounding a portion of the TSV 140b protruding beyond the second surface 107 may be removed. For example, the exposed portion of the side wall insulating layer 135 may be removed by isotropic etching, e.g., wet etching, so that a side wall and the bottom surface of the TSV 140b may be exposed beyond the second surface 107 of side wall insulating layer 135.

However, in a modification of the present embodiment, as shown in FIG. 9A, only the bottom surface of the TSV 140b may be exposed from the side wall insulating layer 135. For example, the side wall insulating layer 135 may remain on the side wall of the TSV 140b if the side wall insulating layer 135 is etched by anisotropic etching, e.g., dry etching.

Figure 13:
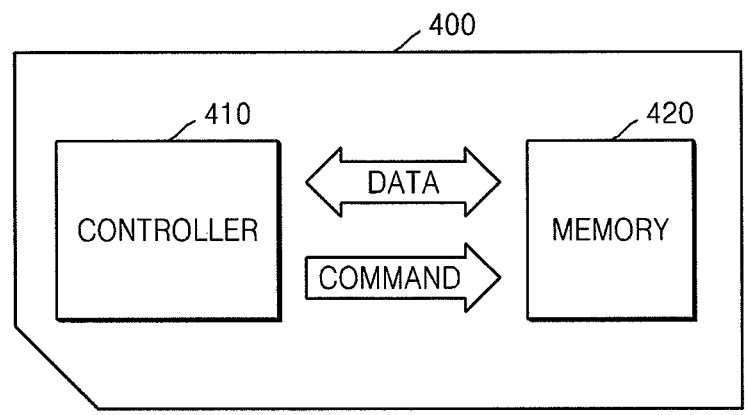
FIG. 13 illustrates a schematic view of a memory card according to an embodiment of the present concept.

FIG. 13 illustrates a schematic view of a memory card 400 according to an embodiment of the present concept.

Referring to FIG. 13, a controller 410 and a memory 420 may be disposed to exchange electrical signals therebetween. For example, the memory 420 and the controller 410 may exchange data according to a command of the controller 410. Accordingly, the memory card 400 may store data in the memory 420 or output data from the memory 420 to the outside of the memory card 400. The memory 420 may include at least one of the semiconductor chips 100 and 100a through 100g of FIGS. 4 through 6 and 9A through 9E, or at least one of the stack modules 300, 300a of FIGS. 10 and 11.

The memory card 400 may be used for various portable electronic devices such as a multimedia card (MMC) and a secure digital card (SD).

Figure 14:
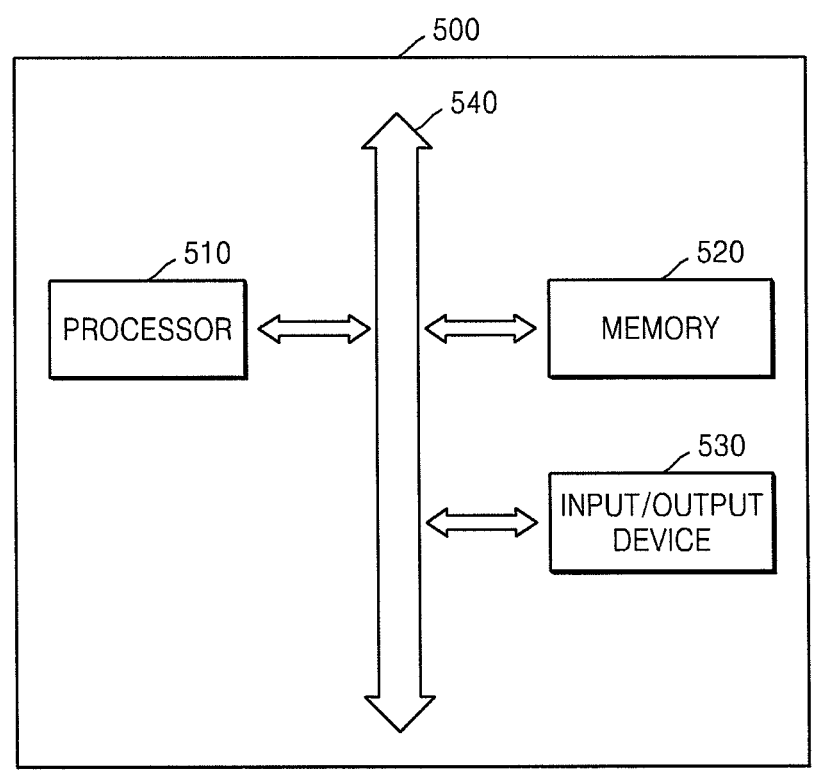
FIG. 14 illustrates a schematic view of a system according to an embodiment of the present concept.

FIG. 14 illustrates a schematic view of a system 500 according to an embodiment of the present concept.

Referring to FIG. 14, a processor 510, an input/output device 530, and a memory 520 may exchange data with one another using a bus. The processor 510 may execute a program, and control the system 500. The input/output device 530 may input or output data of the system 500. The system 500 may be connected to an external device, such as a personal computer (PC) or a network, by using the input/output device 530 to exchange data with the external device.

The memory 520 may store code and data for operating the processor 510. For example, the memory 420 may include at least one of the semiconductor chips 100 and 100a through 100g of FIGS. 4 through 6 and 9A through 9E, or at least one of the stack modules 300, 300a of FIGS. 10 and 11.

For example, the system 500 may be used for various portable electronic devices such as a mobile phone, an MP3 player, a navigator, a solid state disk (SSD), and a household appliance.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
an underlying component including a first pad;
a first semiconductor chip stacked on the underlying component; and
a second semiconductor chip stacked on the first semiconductor chip and including a second pad,
wherein the first semiconductor chip includes:
a semiconductor layer having a first surface and a second surface opposite to each other;
a conductive electrode on the first surface of the semiconductor layer;
a first insulating layer between the conductive electrode and the semiconductor layer to electrically insulate the conductive electrode from the semiconductor layer;
a second insulating layer on the first surface of the semiconductor layer to cover the conductive electrode;
a through-silicon via (TSV) passing through the semiconductor layer, the first insulating layer, an individual one of the conductive electrode, and the second insulating layer, the TSV electrically connecting the first pad of the underlying component with the second pad of the second semiconductor chip; and
a sidewall insulating layer at least in part surrounding a sidewall of the TSV and electrically insulating the conductive electrode layer from the TSV.

2. The semiconductor device as claimed in claim 1, wherein:
the conductive electrode and the first insulating layer are a gate electrode and a gate insulating layer of a transistor respectively.

3. The semiconductor device as claimed in claim 2, further comprising:
a well region defined in the semiconductor layer and including a source region, a drain region, and a channel region.

4. The semiconductor device as claimed in claim 3, further comprising:
a conductive pad disposed on the second insulating layer and electrically connected to the TSV.

5. The semiconductor device as claimed in claim 3, further comprising:
a multi-layer wiring pattern disposed on the second insulating layer and electrically connected to the TSV;
an inter-metal insulating layer disposed on the second insulating layer and covering the multi-layer wiring pattern; and
a conductive pad disposed on the inter-metal insulating layer and electrically connected to the TSV through the multi-layer wiring pattern.

6. The semiconductor device as claimed in claim 5, further comprising a plurality of contact plugs passing through the second insulating layer and connecting the conductive electrode, the source region, and the drain region to the multi-layer wiring pattern.

7. The semiconductor device as claimed in claim 6, wherein the source region and the drain region are n-type regions and are connected to a ground voltage source through the multi-layer wiring pattern, and the conductive electrode is connected to a power voltage source through the multi-layer wiring pattern.

8. The semiconductor device as claimed in claim 6, wherein the source region and the drain region are p-type regions and are connected to a power voltage source through the multi-layer wiring pattern, and the conductive electrode is connected to a ground voltage source through the multi-layer wiring pattern.

9. The semiconductor device as claimed in claim 5, further comprising an integrated circuit layer disposed between the first surface of the semiconductor layer and the second insulating layer and electrically connected to the multi-layer wiring pattern.

10. The semiconductor device as claimed in claim 9, wherein:
the integrated circuit layer comprises:
a volatile memory cell including a gate electrode, and/or a non-volatile memory cell including a control gate electrode, and
the conductive layer includes a same material as the gate electrode and/or the control gate electrode layer.

11. The semiconductor device as claimed in claim 1, wherein the conductive electrode has an opening, an area of which opening is greater than a sum of a cross-sectional area of the TSV and a cross-sectional area of the sidewall insulating layer, and the TSV extends through the opening.

12. The semiconductor device as claimed in claim 1, wherein the TSV vertically passes through the conductive electrode and the semiconductor layer.

13. The semiconductor device as claimed in claim 1, wherein:
a portion of the TSV protrudes from the second surface of the semiconductor layer and contacts the first pad of the underlying component or the second pad of the second semiconductor chip, and
the sidewall insulating layer exposes a sidewall of the portion of the TSV protruding from the second surface of the semiconductor layer, and
the sidewall insulating layer is a single, continuous layer that insulates the TSV from the conductive electrode and the semiconductor layer.

14. The semiconductor device as claimed in claim 1, wherein the TSV has a width that decreases or increases toward the second surface of the semiconductor layer.

15. The semiconductor device as claimed in claim 1, wherein the TSV comprises a first portion having a constant width and a second portion having a width that decreases toward the second surface of the semiconductor layer.

16. The semiconductor device as claimed in claim 1, wherein the TSV further comprises a conductive tap formed around a contact point between the TSV and the second surface of the semiconductor layer.

17. A stack module, comprising:
a module substrate; and
a plurality of semiconductor chips stacked on the module substrate,
wherein at least one semiconductor chip of the plurality of semiconductor chips includes:
a semiconductor layer having a first surface and a second surface opposite to each other;
a conductive electrode disposed on the first surface of the semiconductor layer;
a first insulating layer interposed between the conductive electrode and the semiconductor layer to electrically insulate the conductive electrode from the semiconductor layer;
a second insulating layer disposed on the first surface of the semiconductor layer to cover the conductive electrode;
a through-silicon via (TSV) passing through the semiconductor layer the first insulating layer, an individual one of the conductive electrode, and the second insulating layer, and
a sidewall insulating layer at least in part surrounding a sidewall of the TSV and electrically insulating the semiconductor layer and the conductive electrode from the TSV,
wherein the at least one semiconductor chip is electrically connected to an adjacent semiconductor chip through the TSV.

18. The stack module as claimed in claim 17, wherein at least one of the plurality of semiconductor chips is different in type from others.

19. The stack module as claimed in claim 17, wherein the at least one semiconductor chip further comprises a redistribution line for electrically connecting the TSV of the at least one semiconductor chip to an adjacent semiconductor chip.

20. A memory card, comprising:
a housing;
a memory chip disposed in the housing; and
a controller chip disposed above or under the memory chip in the housing and controlling the memory chip,
wherein the memory chip includes:
a semiconductor layer having a first surface and a second surface opposite to each other;
a conductive electrode disposed on the first surface of the semiconductor layer;
a first insulating layer interposed between the conductive electrode and the semiconductor layer to electrically insulate the conductive electrode from the semiconductor layer;
a second insulating layer disposed on the first surface of the semiconductor layer to cover the conductive electrode;
a through-silicon via (TSV) passing through the semiconductor layer, the first insulating layer, an individual one of the conductive layer and the second insulating layer; and
a sidewall insulating layer at least in part surrounding a sidewall of the TSV and electrically insulating the semiconductor layer and the conductive electrode from the TSV;
wherein the memory chip is electrically connected to the controller chip through the TSV.

* * * * *